United States Patent
Nakamura

(10) Patent No.: US 6,730,525 B2
(45) Date of Patent: May 4, 2004

(54) METHOD OF MANUFACTURING A ELECTRODE OF CAPACITOR

(75) Inventor: Takashi Nakamura, Ukyo-ku (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/393,001

(22) Filed: May 12, 2003

(65) Prior Publication Data

US 2004/0014316 A1 Jan. 22, 2004

Related U.S. Application Data

(62) Division of application No. 09/195,376, filed on Nov. 18, 1998, now abandoned.

(30) Foreign Application Priority Data

Nov. 28, 1997 (JP) ............................................. 9-326851

(51) Int. Cl.$^7$ ......................................... H01L 21/8242
(52) U.S. Cl. ............................ 438/3; 438/240; 438/253
(58) Field of Search .......................... 438/3, 238–356, 438/381–399

(56) References Cited

U.S. PATENT DOCUMENTS

| | | | |
|---|---|---|---|
| 5,100,702 A | 3/1992 | Maeda et al. | |
| 5,130,172 A | 7/1992 | Hicks et al. | |
| 5,665,643 A | 9/1997 | Shin | |
| 5,728,626 A | 3/1998 | Allman et al. | |
| 5,763,020 A | 6/1998 | Yang | |
| 5,783,716 A | 7/1998 | Baum et al. | |
| 5,897,912 A | 4/1999 | Shaikh | |
| 6,150,183 A | * 11/2000 | Fukuda et al. | ............... 438/3 |
| 6,337,108 B1 | 1/2002 | Yamaguchi et al. | |

* cited by examiner

Primary Examiner—H. Jey Tsai
(74) Attorney, Agent, or Firm—Merchant & Gould P.C.

(57) ABSTRACT

An organic compound of a noble metal is dissolved in an alcohol to make a coating agent wherein the electrode material configuring a lower electrode is liquefied. On the surface of a substrate 1, the coating agent is applied by spin coating to a thickness of 100 to 1000 Å or so. Heating is performed, using a drying apparatus such as a hot plate or oven to a temperature of 400 to 600° C., and the halogen and organic solvent are evaporated. Even then there is foreign matter 5 underneath, a lower electrode 2 is formed having a flattened surface. On the surface of the lower electrode 2 are formed PZT and an upper electrode 4. Heat treatment is then performed in an oxidizing atmosphere at a high temperature of 650 to 850° C. or so. The ferroelectric material is subjected to crystallization. A lower electrode of a ferroelectric layer having a flat surface is formed.

22 Claims, 2 Drawing Sheets

METHOD OF MANUFACTURING A ELECTRODE OF CAPACITOR

This is a Divisional of application Ser. No. 09/195,376 filed on Nov. 18, 1998 now abandoned.

CROSS-REFERENCE TO RELATED APPLICATION

The entire disclosure of Japanese Patent Application No. Hei 9-326851 filed on Nov. 28, 1997 including specification, claims, drawings and summary are incorporated herein by reference in its entirely.

BACKGROUND OF THE INVENTION

1. Field of the Invention

This invention concerns the formation of electrodes having flat surfaces, and more particularly concerns a method of fabricating capacitors formed by the lamination of a lower electrode, dielectric layer, and upper electrode on a substrate, such as on an insulating film provided in a semiconductor layer, as in the capacitors in ferroelectric memories and DRAMs, etc. The present invention further concerns a method of fabricating capacitors such that the capacitor characteristics are not affected by irregularities in the substrate surface.

2. Description of the Related Art

Such ferroelectric materials as those based on PZT (Pb (Zr, Ti) $O_3$) or SBT ($SrBi_2Ta_2O_9$) are used in the capacitors that configure ferroelectric memories, while high-dielectric materials such as those based on BST ((Ba, Sr) $TiO_3$) are used in the capacitors used in DRAMs.

Either Pt or Ir, or an alloy thereof, which is thermally stable and has a lattice constant near that of the ferroelectric material is used for the electrode material in the capacitors noted above. The reason for this is that, in order to crystallize the ferroelectric layer, the lattice constant thereof needs to be matched with the lattice constant of the adjacent ferroelectric material. In addition, the dielectric material, after film formation, is annealed in an oxygen atmosphere at 650 to 850° C. to crystallize it.

Also, noble metal oxides such as $IrO_2$, $RuO_2$, $RhO_2$, and $RhO_3$ exhibit electrical conductivity, and so are used as electrodes, either laminated with the metal layers noted above, or used by themselves.

These electrode materials are generally made into films by sputtering methods since they are mainly composed of noble metals.

With the capacitor fabrication method described above, however, the following problems are encountered. When a sputtering method is employed, if there are irregularities or foreign matter on the surface of the substrate, irregularities will be formed just like that on the surface of the lower electrode. As diagrammed in FIG. 4A, for example, when foreign matter 15 is present on the surface of a substrate 11, the place where the foreign matter 15 is will mound up when the lower electrode 12 is formed. When a ferroelectric layer 13 is formed thereupon in the same manner, by a sputtering method, an irregularity will also be formed by the foreign matter 15 in the ferroelectric layer 13, as diagrammed in FIG. 4A, and an irregularity will be formed similarly also in the upper electrode 14 on top of that. This irregularity will form a weak point where the film thickness is thin in the ferroelectric layer 13 where a step 21 is, resulting in low voltage resistance and a danger of shorting out between the two electrodes.

The same sort of problem arises when using a vacuum vapor deposition or CVD method. And when the ferroelectric layer 13 is formed using a sol-gel method, problems such as those noted below arise.

As diagrammed in FIG. 4B, the surface of the dielectric layer 13 is flattened, and the upper electrode 14 is also formed flat. However, at the place where the lower electrode 12 mounds up due to foreign matter 15 on the substrate 11, the film thickness of the ferroelectric layer 13 becomes very thin, forming a weak point, and leading to the same problems as noted earlier.

There are also surface irregularities that are caused not by foreign matter but by crystal grain. As diagrammed in FIG. 5, for example, when a capacitor is formed on something like a polysilicon film 16, the dielectric layer film thickness becomes locally thin due to irregularities in the surface thereof, just as when there is foreign matter, resulting in crystallinity degradation and flaws.

Also, when forming plugs of polysilicon or tungsten (W) in contact holes provided in $SiO_2$ films and the like, there are instances where steps form between the surfaces of the $SiO_2$ and the plug. The same thing is true in cases of such steps.

SUMMARY OF THE INVENTION

An object of the present invention is to resolve the problems noted in the foregoing, providing electrodes the upper surfaces of which are flat even when there are irregularities in the lower surface of the electrode. More specifically, this object is to flatten the surface of the lower electrode in the ferroelectric layer. Another object of the present invention is to make the film thickness uniform in the ferroelectric layer formed on the electrode, even when there are irregularities on the lower surface of the electrode. Another object of the present invention is to provide capacitors that exhibit good capacity characteristics and voltage resistance, and wherewith improved production yield can be realized.

The electrode formation method in the present invention is a method of forming electrodes wherein electrodes made from materials containing a noble metal are formed on a substrate, wherein also the noble metal is converted to a compound that can be dissolved in a solvent, and formed into a liquefied coating agent that is coated onto the substrate, after which the liquid noble metal is solidified to from the lower electrode.

The capacitor fabrication method based on the present invention is one wherein a lower electrode made from material containing a noble metal is formed on a substrate, a dielectric layer is formed on the lower electrode, and an upper electrode is formed on the dielectric layer, characterized further in that the lower electrode is formed so that the surface thereof is flattened, by applying a coating agent wherein the electrode material is liquefied, and in that the dielectric layer is provided on the lower electrode.

The capacitor fabrication method in the present invention is a method wherein a lower electrode made from material containing a noble metal is formed on a substrate, a dielectric layer is formed on the lower electrode, and an upper electrode is formed on the dielectric layer, further characterized in that the lower electrode is formed so that the surface thereof is flattened by applying an electrode material coating agent, and in that the dielectric layer is provided on the lower electrode.

By noble metal here is meant a thermally and chemically stable metal exhibiting outstanding electrical conductivity, such as Au, Pt, Ir Os, Ag, Pd, Rh, Ru, or Re.

It is particularly effective to form the dielectric layer from a ferroelectric material or a high-dielectric material.

More particularly, an organic compound or halide of the noble metal is dissolved in an organic solvent to form a coating agent, this coating agent is applied to the substrate, and the organic material or halogen is then evaporated. By so doing it is possible to form a lower electrode the surface whereof is flattened.

When the lower electrode is formed from an electrically conductive material made into a laminated structure, if at least one of the layers in that laminated structure is flattened by the application of the coating agent, the surface of the lower electrode will be flattened.

When evaporating the organic material or halogen, it is possible also to form an electrically conductive oxide consisting of the oxide of the noble metal, whereupon a lower electrode consisting of a metal material can be formed by reducing the oxide of the noble metal.

The characteristics of the present invention, together with other objects, applications, and benefits thereof, etc., should become more evident upon perusal of the embodiments and drawings.

DESCRIPTION OF THE PREFERRED EMBODIMENTS

Figure 1:
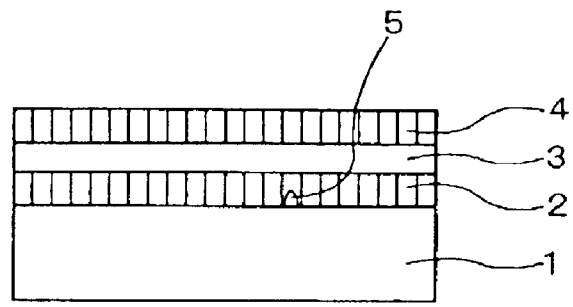
FIGS. 1 and 2 are cross-sectional diagrams of the main features of a capacitor formed by a fabrication method of the present invention.

The present invention, as described in the foregoing, is based on assiduous research done in the interest of preventing declines in production yield and device characteristics due to surface irregularities or contamination when forming capacitors containing a ferroelectric material or high-dielectric material on the surface of a substrate wherein an insulating film or the like is formed onto a semiconductor substrate, in particular. The inventor found that noble metals such as Pt or Ir readily form compounds both with halogens such as fluorine or chlorine and with organic compounds such as those having the $C_3H_5$ group, and such compounds exhibit the property of readily decomposing at temperatures ranging from 150 to 450° C. or so. Some of these noble metals, moreover, readily form metal oxides when the compounds are decomposed, and such of these noble metal oxides as $OsO_2$, $IrO_x$, $PtO_x$, $RuO_x$, $ReO_x$, and $RhO_x$ exhibit electrical conductivity together with outstanding heat resistance. Among these oxides, $IrO_2$, $ReO_2$, and $RuO_2$ exhibit particularly outstanding heat resistance, and can be used as is, in the metal oxide form, as electrode materials. By forming lower electrodes of ferroelectric materials, etc., requiring heat treatment at high temperatures by the application of an electrode material coating agent, the problems caused by irregularities as noted in the foregoing can be resolved, even when foreign matter 5 is present on the surface of the substrate 1, as diagrammed in FIG. 1.

The resistance of the noble metal oxides can be lowered further, moreover, by subjecting them to a reduction treatment. This reduction treatment changes the lattice constant, furthermore, and in some cases the compatibility with the ferroelectric material formed above is improved.

A capacitor fabrication method according to the present invention is now described, making reference to the drawings. First, a coating agent is produced wherein the electrode material constituting the lower electrode is liquefied. In this embodiment, the coating agent is produced by dissolving $PtCl_4$, which is a noble metal halide, in an alcohol, which is an organic solvent. As diagrammed in FIG. 1, on the surface of a substrate 1 wherein an insulating film such as $SiO_2$ is formed on the surface of a semiconductor layer, the coating agent is applied, by spin coating or dipping, to a thickness of 100 to 1000 Å or so. The halogen and organic solvent are vaporized by a heat treatment for 20 to 60 minutes or so at a temperature of 400 to 600° C. using a drying device such as a hot plate or oven.

By heating the $PtCl_4$ coated on in this way to a temperature at which it will decompose, a lower electrode 2 is formed having a flattened surface, even when there is foreign matter 5 underneath.

On the surface of the lower electrode 2, a dielectric material such as PZT (Pb (Zr, Ti) $O_3$) or SBT ($SrBi_2Ta_2O_9$) is formed by a sputtering method into a film having a thickness of 500 to 3000 Å or so. A sputtering method is then used to form an upper electrode 4 of, for example, $IrO_2$, Pt, or Ir. Then a heat treatment is performed for 1 to 60 minutes or so at a temperature of 650 to 850° C. or so in an oxidizing atmosphere. In this manner the ferroelectric material is crystallized.

As based on the present invention, when forming a capacitor wherein a dielectric layer of a ferroelectric material, etc., is sandwiched between electrode materials containing a noble metal, on a substrate wherein an insulating film or the like is laminated on a semiconductor layer, the lower electrode is formed by coating the electrode material made into a coating agent onto the substrate. Accordingly, as diagrammed in FIG. 1, the surface of the lower electrode 2 is flattened even when foreign matter 5 is present on the substrate 1. For this reason, the dielectric layer 3 formed by sputtering, etc., thereupon is formed in a parallel plane. Thus, even if there are irregularities on the substrate 1, part of the lower electrode 2 does not mound up into the dielectric layer 3. That being so, there is no longer any danger of contact between the lower and upper electrodes. As a result, flaws or performance failures caused by contact between the upper and lower electrodes do not occur, production yield is improved, and high quality capacitors are obtained.

Where there is foreign matter 5, moreover, the film thickness of the lower electrode 2 becomes thin. The electrode, however, unlike the dielectric layer, will not affect the capacitor characteristics, even when there are thin places in the film thickness, so long as it exhibits conductivity.

In this embodiment, platinum was used as the noble metal, but this may be some other noble metal such as Ir, Rh, or Os. Also, chlorine was adopted for making the halide, but some other halide former may be adopted instead, such as Br, I, or F. And, instead of an alcohol, an ether may be used as the organic solvent.

The heating temperature need only be a temperature at which the halide will decompose. More specifically, the temperature need be approximately 250° C. for $PtBr_2$, 180° C. for $PtBr_4$, 325° C. for $PtI_2$, 250° C. for $IrF_3$, 450° C. for $RhCl_3$, and 350 to 450° C. for $OsBr_4$ or $OsCl_3$. $RhF_6$ and $RhBr_3$ also decompose at low temperature. Thus, by using Pt, Ir, Rh, or Os, etc., as halide formers with these halogens and dissolving them in an organic solvent such as an alcohol or ether, an electrode material coating agent can be prepared having Pt, Ir, Rh, or Os, etc., as its main component.

The Pt, Ir, or other noble metal is oxidized by the oxygen in the organic solvent, and a stable electrically conductive oxide such as $IrO_2$, $RuO_2$, $RhO_2$, or $RhO_3$ is formed. If necessary, crystallization annealing is performed at high temperature. In the case of Pt, $PtO_2$ is formed. The $PtO_2$ obtained will not be completely anhydrous, and will decompose at about 450° C., making it unsuitable as an electrode material. For this reason, when Pt is used, after vaporizing the halogen and organic solvent, additional reduction should be performed in a reducing atmosphere to remove the oxygen and make a simple Pt electrode. With the other halide formers also, reduction can be done to make a simple metal. Furthermore, this need not be one type of metal only, but may be an oxide containing two or more metallic elements, such as $(Ir, Ru) O_2$ or $(Pt, Ir) O_2$, or an alloy made of two or more of these reduced metallic elements.

When preparing the electrode material coating agent, an organic compound of the noble metal may be adopted instead of forming a halogen compound of the noble metal. Examples of such organic compounds include $Ir(C_3H_5)_3$, $Pt(C_3H_5)_3$, $Ir(C_3H_5) (C_5H_5)$, and $Pt(C_3H_5) (C_5H_5)$. Even with such organic compounds as these, by raising the temperature to between 200 and 500° C. or so, they decompose and the organic substance vaporizes, so that electrically conductive noble metal oxides can be formed.

Figure 2:
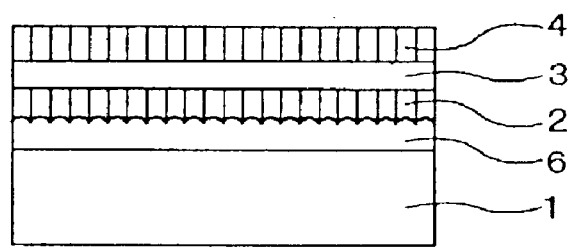
Figure 3:
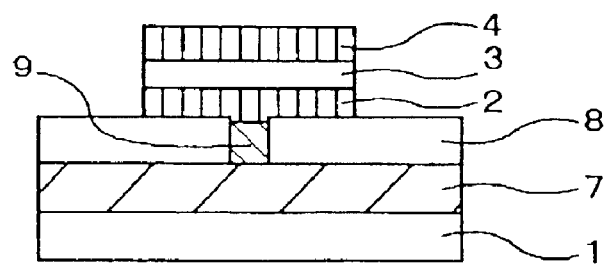
FIG. 3 is a cross-sectional diagram of the main features of another embodiment of a capacitor formed by a fabrication method of the present invention.
Figure 4A:
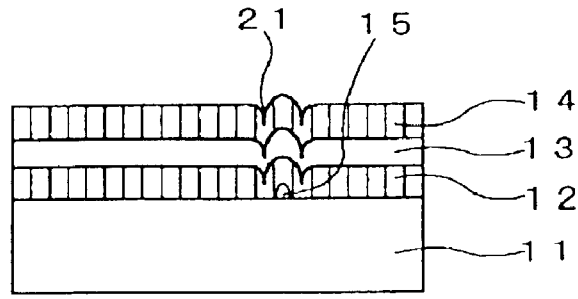
FIGS. 4A and 4B are cross-sectional diagrams of a capacitor formed by a conventional fabrication method.
Figure 4B:
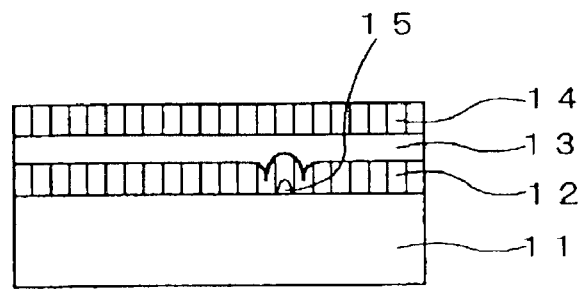
Figure 5:
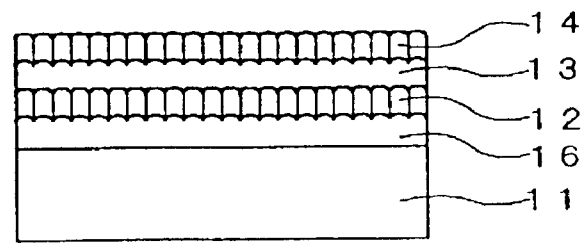
FIG. 5 is a cross-sectional diagram of a capacitor formed by a conventional fabrication method.

In the embodiment described in the foregoing, the description assumes the case where foreign matter is present on the substrate, but this is not limited to foreign matter or irregularities. Even in cases of irregularities caused by the crystal grain of a polysilicon film 6, etc., on the substrate 1, as diagrammed in FIG. 2, or of a step developing between the surfaces of a plug 9 and insulating film 8, when forming the lower electrode 2 connecting to the plug 9 inside contact holes provided in the insulating film 8 consisting of $SiO_2$, etc., in order to make connection with a wiring layer 7 on the substrate 1 as diagrammed in FIG. 3, the upper surface of the lower electrode 2 is flattened, wherefore the dielectric layer is formed so that it has a parallel surface, and the capacitor characteristics become very stabilized.

In the example described in the foregoing, furthermore, the lower electrode is formed by one layer. However, in a case where it is formed in multiple layers of $IrO_2$ and Pt, for example, and the lattice constant of the Pt layer is matched with that of the ferroelectric layer, in a structure wherein the diffusion of elements such as Pb of the ferroelectric material is prevented by the $IrO_2$ layer, all of the layers may be formed by the flattening method described earlier, but, if at least one layer is formed by the flattening method described earlier, the surface of the lower electrode 2 will be flattened. For that reason, the dielectric layer formed on top of that will be formed with a parallel surface also, wherefore there will be no occurrence of failures caused by electrode shorting or of deteriorated capacitor performance. In these cases, it is preferable that the lowermost layer be fabricated by the fabrication method described in the foregoing.

In the present specification, the term substrate is used inclusive of the insulating film formed on the semiconductor substrate, but this may be a substrate wherein no insulating film is present. In the present specification, in other words, "on the substrate" includes both directly and indirectly on the substrate.

When the present invention is implemented, even in cases where the electrode material that sandwiches the dielectric layer of either a ferroelectric material or high-dielectric material consists of a material containing Pt, Ir, or some other noble metal, the lower electrode is formed by liquefaction, wherefore the production yield of capacitors formed on substrates that can have irregularities in them, for use in ferroelectric memories and semiconductor memories such as DRAMs, is improved, while performance is stabilized and reliability is improved.

In the foregoing, the present invention is described in terms of a preferable embodiment, and the terms used therein are not used in a limiting sense, but rather to facilitate the description. Thus alterations are allowable, within the scope of the attached claims, without exceeding the scope and spirit of the present invention.

What is claimed is:

1. A method of forming a device on a semiconductor substrate, the device having a noble metal electrode, a dielectric layer on the noble metal electrode and an upper-electrode on the dielectric layer, the method comprising the steps of:
    A) forming said noble metal electrode which having a fiat surface for receiving said dielectric layer of uniform thickness by performing the following steps:
        a1) providing said semiconductor substrate for forming said noble metal electrode on an electrode receiving surface of said substrate, said electrode receiving surface having irregularities;
        a2) preparing a coating agent wherein said noble metal that has been converted into a compound soluble in a solvent is liquefied by said solvent;
        a3) applying an effective amount of said liquefied coating agent to said electrode receiving surface to avoid influence of said irregularities on said electrode receiving surface of said semiconductor substrate; and
        a4) removing said solvent from said coating agent to form said noble metal electrode having said fiat surface for receiving the dielectric layer wherein said thickness of the dielectric layer is uniform and avoid influence of said irregularities on said electrode receiving surface of said semiconductor substrate;
    B) forming said dielectric layer on said noble metal electrode; and
    C) forming said upper electrode on said dielectric layer.

2. The method according to claim 1,
    wherein said coating agent is an organic solvent in which an organic compound of a noble metal is dissolved; and
    wherein said organic material is evaporated from said organic solvent to remove said solvent.

3. The method according to claim 1,
    wherein said coating agent is an organic solvent in which a halide of a noble metal is dissolved; and
    wherein halogen is evaporated from said organic solvent to remove said solvent.

4. The method according to claim 2, wherein, when evaporating said organic material, an electrically conductive oxide consisting of an oxide of said noble metal is formed.

5. The method according to claim 3, wherein, when evaporating said halogen, an electrically conductive oxide consisting of an oxide of said noble metal is formed.

6. The method according to claim 4, wherein said electrically conductive oxide is reduced.

7. The method according to claim 5, wherein said electrically conductive oxide is reduced.

8. The method according to claim 1, wherein said lower electrode is a laminated structure of electrically conductive material, and at least one layer in said laminated structure is formed by application of said coating agent.

9. The method according to claim 3, wherein said halide of said noble metal is $PtCl_4$.

10. The method according to claim 3, wherein said halide of said noble metal is $PtBr_2$.

11. The method according to claim 3, wherein said halide of said noble metal is $PtBr_4$.

12. The according to claim 3, wherein said halide of said noble metal is $PtI_2$.

13. The method according to claim 3, wherein said halide of said noble metal is $IrF_3$.

14. The method according to claim 3, wherein said halide of said noble metal is $RhCl_3$.

15. The method according to claim 3, wherein said halide of said noble metal is $OsBr_4$.

16. The method according to claim 3, wherein said halide of said noble metal is $OsCl_3$.

17. The method according to claim 3, wherein said halide of said noble metal is $RhF_6$.

18. The method according to claim 3, wherein said halide of said noble metal is $RhBr_3$.

19. The method according to claim 2, wherein said halide of said noble metal is $Ir(C_3H_5)_3$.

20. The method according to claim 2, wherein said halide of said noble metal is $Pt(C_3H_5)_3$.

21. The method according to claim 2, wherein said halide of said noble metal is $Ir(C_3H_5)(C_5H_5)$.

22. The method according to claim 2, wherein said halide of said noble metal is $Pt(C_3H_5)(C_5H_5)$.

* * * * *

UNITED STATES PATENT AND TRADEMARK OFFICE
CERTIFICATE OF CORRECTION

PATENT NO. : 6,730,525 B2
DATED : May 4, 2004
INVENTOR(S) : Nakamura

It is certified that error appears in the above-identified patent and that said Letters Patent is hereby corrected as shown below:

<u>Title page,</u>
Item [22], Filed, "May 12, 2003" should read -- March 20, 2003 --

Signed and Sealed this

Ninth Day of August, 2005

JON W. DUDAS
*Director of the United States Patent and Trademark Office*